United States Patent
Rye et al.

(10) Patent No.: US 9,491,880 B2
(45) Date of Patent: Nov. 8, 2016

(54) CIRCUIT ASSEMBLY FOR COMPACT ACOUSTIC DEVICE

(71) Applicant: Google Technology Holdings LLC, Mountain View, CA (US)

(72) Inventors: Ryan P Rye, Lawrenceville, GA (US); Christopher B Houghton, Chicago, IL (US); Hae Rim Jeong, Chicago, IL (US); Peter Nanni, Algonquin, IL (US); Peter M Pavlov, Duluth, GA (US); Martin H Ramsden, Lawrenceville, GA (US)

(73) Assignee: Google Technology Holdings LLC, Mountain View, CA (US)

( * ) Notice: Subject to any disclaimer, the term of this patent is extended or adjusted under 35 U.S.C. 154(b) by 113 days.

(21) Appl. No.: 14/457,354

(22) Filed: Aug. 12, 2014

(65) Prior Publication Data
US 2016/0050474 A1    Feb. 18, 2016

(51) Int. Cl.
*H04R 25/00* (2006.01)
*H05K 7/08* (2006.01)
*H04R 1/10* (2006.01)

(52) U.S. Cl.
CPC .............. *H05K 7/08* (2013.01); *H04R 1/1016* (2013.01); *H04R 1/1041* (2013.01); *H04R 1/1075* (2013.01); *H04R 1/1083* (2013.01); *H04R 2201/107* (2013.01); *H04R 2410/05* (2013.01); *H04R 2420/07* (2013.01); *H04R 2430/01* (2013.01); *H04R 2460/17* (2013.01)

(58) Field of Classification Search
CPC ...... H04R 25/60; H04R 25/65; H04R 25/70; H04R 25/356; H04R 25/505; H04R 25/554; H04R 25/604; H04R 25/652; H04R 25/658; H04R 2225/41; H04R 2225/61
USPC ......................................... 381/312, 322, 324
See application file for complete search history.

(56) References Cited

U.S. PATENT DOCUMENTS 6,456,720 B1 * 9/2002 Brimhall ................ H04R 25/60
                                                    381/322
7,905,006 B2 * 3/2011 Kwon ................... H04R 25/652
                                                    381/174

(Continued)

OTHER PUBLICATIONS

Molex, "Rigid Flex Circuits and Assemblies", http://www.molex.com/molex/products/family?key=rigid_flex&channel=products&chanName=family&pageTitle=Introduction; 2012, 2 pages.

(Continued)

*Primary Examiner* — Brian Ensey
(74) *Attorney, Agent, or Firm* — Faegre Baker Daniels LLP

(57) ABSTRACT

A circuit assembly (600) includes a printed circuit board assembly (100). The printed circuit board assembly includes a first circuit board (101), a second circuit board (102), and a first flexible substrate (103) interposed between, and continuous with, the first circuit board and the second circuit board. A second flexible substrate (108) extends from, and is continuous with, the second circuit board. One or more electronic circuits comprising electronic components (301, 302,303,304,305) are disposed along one or more of the first circuit board or the second circuit board. The printed circuit board assembly is folded about a battery (601), with the first circuit board adjacent to the first major face, the second circuit board adjacent to the second major face, and the first flexible substrate spanning the one or more side faces.

18 Claims, 15 Drawing Sheets

(56) References Cited

U.S. PATENT DOCUMENTS

| | | | | |
|---|---|---|---|---|
| 8,655,000 | B1* | 2/2014 | Solum | H04R 25/554<br>381/315 |
| 2001/0036287 | A1* | 11/2001 | Beard | H04R 25/402<br>381/313 |
| 2009/0196449 | A1* | 8/2009 | Platz | H01Q 1/085<br>381/330 |
| 2012/0275621 | A1* | 11/2012 | Elko | H04R 19/01<br>381/92 |
| 2013/0108089 | A1* | 5/2013 | Lin | H04R 1/08<br>381/313 |

OTHER PUBLICATIONS

Molex, "Standard and Custom-Designed Interconnect Products", key=military_aerospace&channel=Industries&channelId=-17&subChannelId=-78&pageTitle=Military%2FAerospace&chanLink=Military%2FAerospace, 2013, 2 pages.

Philips, "EN Bluetooth Stereo Headset", SBH7110, http://www.welcome.philips.com/index.html, 2010, 21 pages.

Hae Rim Jeong, et al., "Headset for a Communication Device", U.S. Appl. No. 29/478,447, Jan. 6, 2014.

Motorola, "Motorola Photon Q 4G LTE", Sprint Printable User Guide, 2013, 113 pages.

\* cited by examiner

CIRCUIT ASSEMBLY FOR COMPACT ACOUSTIC DEVICE

BACKGROUND

1. Technical Field

This disclosure relates generally to electronic devices, and more particularly to electronic acoustic devices.

2. Background Art

Wireless headsets are commonly used with many portable electronic devices. For example, wireless headsets can be used with a smartphone that includes a multimedia player, such as an MPEG-3 music player, to listen to music. Modern headsets take many forms, including over the ear clip on devices and over the head headphones. The most compact headsets are manufactured as "in the ear" or "in the ear canal" earbuds. Earbuds generally include small speakers and fit into either the folds of the human ear or into the ear canal itself.

For an earbud to provide the best sound, it is desirable for it to properly fit the user. Earbuds that do not fit properly can be very uncomfortable to wear after only a short period of use. At the same time, it can be advantageous for earbuds to be as small as possible. Fashion conscious users may be reluctant to use a large earpiece that resembles a vintage hearing aid. This desire to make earbuds smaller while still providing satisfactory acoustic performance creates a tension in that it simply becomes difficult to "fit" all the electronic components necessary for proper acoustic performance into a package that fits within a user's ear canal. This is especially true given the requirement that any wireless earbud also include a battery as an energy source. It would be advantageous to have an improved circuit assembly that allows earbuds to become smaller without compromising acoustic performance.

Figure 1:
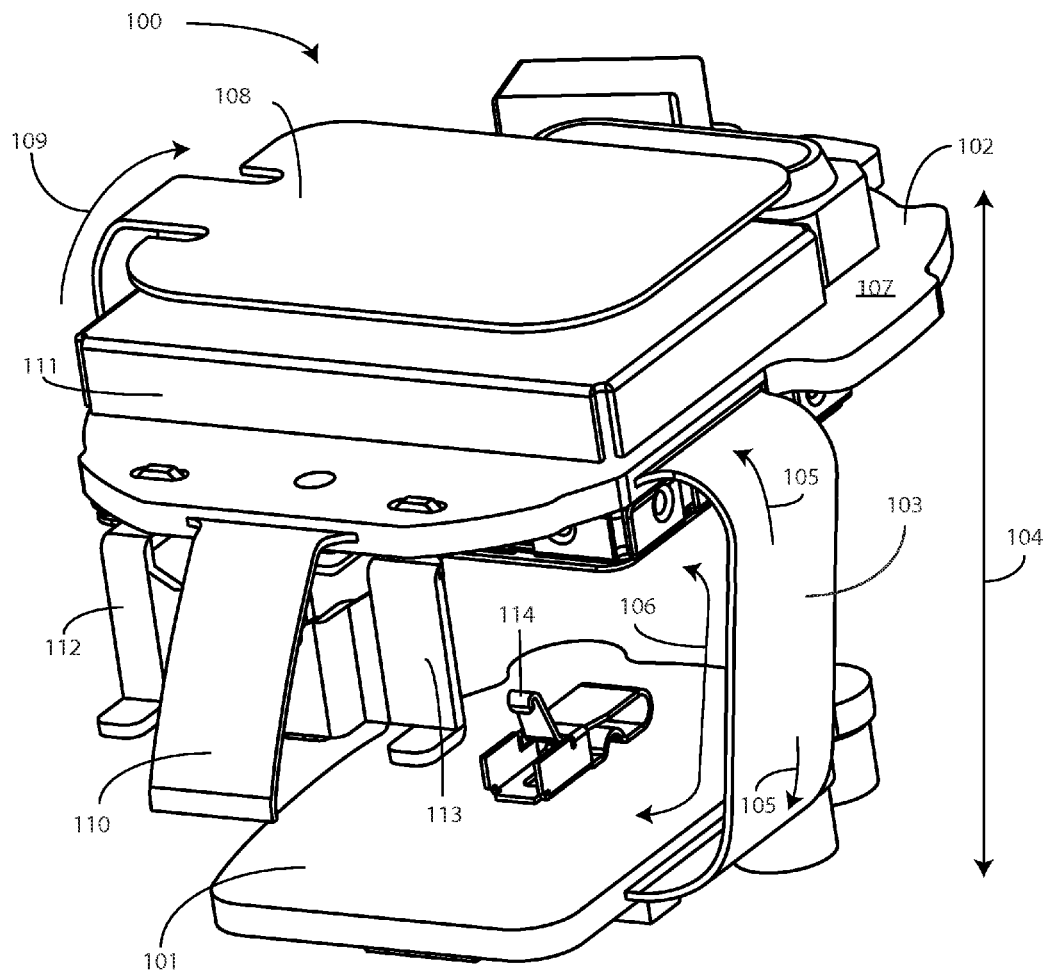
FIG. 1 illustrates a first perspective view of one explanatory printed circuit board assembly in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to improving audio performance in an audio device. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a wireless earbud accessory that is sufficiently compact as to seat flush or below the outer surface/end of the tragus portion of the ear. This low profile insertion capability is unlike prior art headsets, which have portions seating well above the tragus, and that are always visible to others. While some prior art hearing aids and professional wired ear speakers sit below the tragus, these devices do not include wireless communication capability. Wireless communication circuits, including antennas, shields, transceivers, and so forth, require a relatively large amount of space within a device. Advantageously, the printed circuit board assemblies of the present disclosure are sufficiently compact as to provide a below-tragus earbud with wireless communication capabilities.

Embodiments of the disclosure provide a circuit assembly that minimizes volume required for the printed circuit board assembly and related components. Embodiments of the disclosure further optimize a physical arrangement of these components to achieve optimal wireless performance, e.g., optimal radio frequency antenna gain and so forth. Moreover, embodiments of the disclosure additionally optimize the location, arrangement, and spacing of acoustic components, including microphones and acoustic drivers, i.e., speakers for optimal acoustic performance.

In one or more embodiments, a circuit assembly further includes one or more of an infrared sensor or a temperature sensor to automatically detect when a device is inserted into a user's ear canal. By detecting insertion from temperature or touch, embodiments of the disclosure can activate the device when inserted into the ear and deactivate the device once removed from the ear.

In one or more embodiments, a printed circuit board assembly includes at least a first circuit board, a second circuit board, and a flexible substrate interposed between, and continuous with, the first circuit board and the second circuit board. This continuous "board-flex-board" allows the printed circuit board assembly to wrap about a large rechargeable battery without using any connectors or jumpers. The result is a compact circuit assembly offering long device run time. Despite accommodating such a large cell, the continuous nature of the printed circuit board assembly eliminates the need for connectors to interconnect the flexible substrate between the printed circuit boards, which results in a more compact assembly that still ensures user comfort when earbud is positioned in the ear bowl or concha. Embodiments of the disclosure further provide the advantages listed above at a relatively low manufacturing cost. The cost is reduced due to the fact that the various components are simple to assemble due to the overall design of the device and component placement.

In one embodiment, a printed circuit board assembly includes a first circuit board and a second circuit board. A first flexible substrate is then interposed between, and continuous with, the first circuit board and the second circuit board. In one embodiment, a second flexible substrate then extends from, and is continuous with, the second circuit board. One or more electronic circuits can be disposed along one or more of the first circuit board or the second circuit board.

In one embodiment, the various electronic circuits can be strategically placed along the printed circuit board assembly. For example, in one embodiment a first microphone and a second microphone may be disposed along the printed circuit board assembly. A housing into which the printed circuit board assembly will be inserted can define a first microphone port and a second microphone port. The first microphone port and the first microphone are oriented, in one embodiment, to define a first beam along a first axis, while the second microphone port and the second microphone oriented to define a second beam along a second axis. In one embodiment, the first axis and the second axis separated by at least ninety degrees. This allows the first microphone to receive acoustic signals from a user, while the second microphone receives ambient noise that can be used for noise cancelation or other operations in the electronic circuits.

A battery can then be provided to power the one or more electronic circuits. In one embodiment, the battery comprises a first major face, a second major face, and one or more side faces. For example, the battery may be in the form of a coin cell having a first major face that is circular, a second major face that is circular, and a continuous, cylindrical sidewall.

In one embodiment, the printed circuit board assembly can then be folded about the battery with the first circuit board adjacent to the first major face, the second circuit board adjacent to the second major face, and the first flexible substrate spanning the one or more side faces. This "foldable" nature is due to the fact that he first flexible substrate is interposed between, and continuous with, the first circuit board and the second circuit board.

Turning now to FIGS. 1-5, illustrated therein is one embodiment of a printed circuit board assembly 100 in accordance with one or more embodiments of the disclosure. The explanatory printed circuit board assembly 100 of FIG. 1 includes a first circuit board 101 and a second circuit board 102. In one embodiment, each of the first circuit board 101 and the second circuit board 102 is manufactured from multiple layers. Some layers can be selectively placed conductive metal, such as copper or aluminum, while other layers can be insulative. Insulative layers can be manufactured from fiberglass, FR4, or other materials. In one or more embodiments, each of the first circuit board 101 and the second circuit board 102 comprises a fiberglass printed circuit board. In another embodiment, each of the first circuit board 101 and the second circuit board 102 is a FR4 printed circuit board.

In the embodiment of FIGS. 1-5, a first flexible substrate 103 is interposed between, and is continuous with, the first circuit board 101 and the second circuit board 102. The first flexible substrate 103 can be manufactured as a continuous component of the printed circuit board assembly 100 in a variety of ways. Illustrating by example, in one embodiment the first circuit board 101 and the second circuit board 102 can be manufactured as a single, contiguous, unitary circuit board. The conductive and insulative layers of the single, contiguous, unitary circuit board can then be selectively removed along the first flexible substrate 103 until only a single layer of conductive metal from one of the internal layers remains. Insulative material, such as insulative tape, can then be placed about the single layer of conductive metal to form the first flexible substrate 103.

Making the first flexible substrate 103 continuous with the first circuit board 101 and the second circuit board 102 eliminates the need for connectors to be disposed along each of the first circuit board 101 and the second circuit board 102 for connection to an intermediate flexible substrate. This results in more surface area along each of the first circuit board 101 and the second circuit board 102 for electronic components. This elimination of the need for connectors also reduces the overall "stack-up" height 104 of the printed circuit board assembly 100.

The inclusion of the first flexible substrate 103 as a continuous element between the first circuit board 101 and the second circuit board 102 advantageously allows the printed circuit board assembly 100 to fold or otherwise be wrapped around components. For example, the first circuit board 101, the second circuit board 102, and the first flexible substrate 103 of printed circuit board assembly 100 of FIGS. 1-5 are folded 105 to form a "C" shape. As will be shown in the discussion of FIGS. 6-9 below, in one embodiment this "foldability" allows the first circuit board 101, the second circuit board 102, and the first flexible substrate 103 of printed circuit board assembly 100 of FIGS. 1-5 to wrap about a rechargeable battery.

In this illustrative embodiment, the printed circuit board assembly 100 also includes a second flexible substrate 108. In one embodiment, as was the case with the first flexible substrate 103, the second flexible substrate 108 is continuous with a printed circuit board. For example, in the embodiment of FIGS. 1-5, the second flexible substrate 108 extends from, and is continuous with, the second circuit board 102. (Recall from above that relational terms, such as first and second, top and bottom, and the like, may be used solely to distinguish one entity or action from another entity or action without necessarily requiring or implying any actual such relationship or order between such entities or actions.) In one embodiment, the second flexible substrate 108 is manufactured in the same manner as was the first flexible substrate 103, namely, by selectively removing layers from a single, contiguous, unitary circuit board until only a single layer of conductive metal from one of the internal layers remains, and then covering that layer with insulative tape or other insulating material.

As will be described in more detail below, in one embodiment the second flexible substrate 108 can be folded back over the second circuit board 102. In the illustrative embodiment of FIGS. 1-5, the second flexible substrate 108 is folded back atop the second circuit board 102. This allows the second flexible substrate 108 to define the top of the printed circuit board assembly 100 when the second circuit board 102 is disposed above the first circuit board 101. Advantageously, in one or more embodiments the second flexible substrate 108 can be used as a touch sensor disposed along the outermost portion of an earbud when the earbud is disposed within a user's ear.

By placing the second flexible substrate 108 just beneath a surface of a housing of an electronic device, in one embodiment a touch sensitive surface may be created along the housing. The user can then control the device by interfacing with the touch sensitive surface, thereby eliminating the need for buttons or other controls that, when actuated, may move the earbud within the user's ear. Placing the touch sensitive surface on a surface of the device provides for simpler user operation in one embodiment.

The second flexible substrate 108 can define a touch sensor in one of a variety of ways. In one or more embodiments, the second flexible substrate 108 defines a capacitive touch-sensing surface. The capacitive touch-sensitive surface can be configured to detect movement of, for example, a user's finger, occurring within a region defined by, for example, the outer perimeter of the second flexible substrate 108. In one embodiment, the second flexible substrate 108 can comprise a first conductor or a first plurality of conductors and a second conductor or second plurality of conductors. These conductors can then cross over each other to define a grid of pixels (where only two conductors are used the second flexible substrate 108 will define a single, large pixel forming a grid of one pixel). One conductor or set of conductors can be coupled to a touch driver, operable with a control circuit, which delivers a signal to each pixel of the grid. Electrical charges then travel to the pixel(s) of the grid. Electromagnetic fields are then created about the pixel(s). The fields are altered by interaction of a user's finger or other conductive object interacting with the second flexible substrate 108. This alteration allows the control circuit to detect touch input.

In one embodiment, where multiple pixels are used, the electrodes defining each pixel along the second flexible substrate 108 can define a coordinate plane. Said differently, each pixel can correspond to a different a particular geographic coordinate along the second flexible substrate 108. By detecting a change in the capacitance of one or more pixels, the control circuit can thus determine an X and Y coordinate at which the touch input occurs. This locational information can be used to control data the device, such as to deliver volume up or volume down information. Other forms of touch-sensitive surfaces disposed along the second flexible substrate While a capacitive touchpad is one technology suitable for use with the second flexible substrate 108, those of ordinary skill in the art having the benefit of this disclosure will understand that other technologies can be used as well. For example, the second flexible substrate 108 can detect touch, in one or more embodiments, using a surface acoustic wave touch sensor, a surface capacitance sensor, a projected capacitance sensor, a mutual capacitance sensor, a self-capacitance sensor, an infrared grid sensor, an infrared acrylic projection sensor, an optical imaging sensor, a dispersive signal sensor, an acoustic pulse recognition sensor, and so forth.

As noted above, the inclusion of the first flexible substrate 103 and the second flexible substrate 108 advantageously allows the printed circuit board assembly 100 to be folded along each flexible substrate. In the illustrative embodiment of FIGS. 1-5, the second flexible substrate 108 is folded back atop the second circuit board 102. Accordingly, in FIGS. 1-5, the printed circuit board assembly is folded in an "S" shape defined by C shape 106 and reverse C shape 109. Other geometric configurations achievable by folding one or both of the first flexible substrate 103 or the second flexible substrate 108 will be obvious to those of ordinary skill in the art having the benefit of this disclosure.

It should be noted that any number of flexible substrates can extend from, or be interposed between, the first circuit board 101 and the second circuit board 102. Illustrating by example, the printed circuit board assembly 100 of FIGS. 1-5 also includes a third flexible substrate 110 that extends from, and is contiguous with, the second circuit board 102. The third flexible substrate 110 is shown bare in FIG. 1. However, in FIGS. 2-5, an acoustic driver 201 is coupled to the third flexible substrate 110. In one embodiment, the acoustic driver 201 comprises a balanced armature speaker.

In one embodiment, wires from the acoustic driver 201 are soldered to the third flexible substrate 110, thereby allowing the third flexible substrate 110 to operate as a cantilevered "diving board" for the acoustic driver 201. As will be shown in more detail below with reference to FIG. 14, this allows the third flexible substrate 110 to deflect such that the acoustic driver 201 can be positioned properly within a housing. The acoustic driver 201 is a speaker in one embodiment that will serve as the acoustic output of an electronic device that delivers sound to a user's eardrum.

In one embodiment, the first circuit board 101 and the second circuit board 102 each define a first major face and a second major face. For example, the second circuit board 102 defines first major face 107 and second major face 307. The first circuit board 101 similarly defines a first major face and a second major face. In one embodiment, a plurality of electrical components, e.g., electronic components 301,302, 303,304,305, can be disposed on one or more of the first major face of the first circuit board 101, the second major face of the first circuit board, the first major face 107 of the second circuit board 102, the second major face 307 of the second circuit board 102, or combinations thereof. For example, in FIGS. 3-4, electrical components 302,303,304, 305 are shown disposed on, and coupled to, a first major face of the first circuit board 101.

In one embodiment, at least one electronic component 301 of the one or more electronic components 301,302,303, 304,305 comprises a control circuit. The control circuit can include one or more processors, such as an application processor and, optionally, one or more auxiliary processors. One or both of the application processor or the auxiliary processor(s) can be a microprocessor, a group of processing components, one or more Application Specific Integrated Circuits (ASICs), programmable logic, or other type of processing device. The application processor and the auxiliary processor(s) can be operable with the various components disposed along one or more of the first major face of the first circuit board 101, the second major face of the first circuit board, the first major face 107 of the second circuit board 102, the second major face 307 of the second circuit board 102, or combinations thereof. For example, the control circuit can be operable with the acoustic driver 201, one or more microphones, the second flexible substrate 108 when configured as a capacitive touch sensor, and so forth.

In one embodiment, the control circuit can be configured to process and execute executable software code to perform the various functions of the electronic device into which the printed circuit board assembly is disposed. One of the electronic components 301,302,303,304,305 can comprise a storage device, such as memory. The memory can optionally store the executable software code used by the control circuits 116 during operation. The program instructions may alternatively be stored on-board the control circuit. The memory devices may include either or both static and dynamic memory components, may be used for storing embedded code.

In this illustrative embodiment, one electrical component comprises a near-field communication circuit configured for wireless communication with one or more other devices or networks. The chip antenna 202 of the wireless communication circuit is shown in this embodiment, as the other wireless communication circuitry is disposed beneath electromagnetic shield 111. The networks can include a local area network and/or personal area network. The communication circuit may utilize wireless technology for communication, such as, but are not limited to, peer-to-peer or ad hoc communications such as HomeRF, Bluetooth and IEEE 802.11 (a, b, g or n). The communication circuit can include wireless communication circuitry, one of a receiver, a transmitter, or transceiver, and one or more antennas.

In one embodiment, the one or more electronic components 301,302,303,304,305 can include a temperature sensor to detect a rise in temperature. For example, in this embodiment, electrical components 303,304 are temperature sensors. When the printed circuit board assembly 100 is disposed in an earbud, the temperature sensors can detect increased temperature in response to the earbud being seated in the ear. The control circuit can use this increase in temperature to active the remaining electrical components.

In one embodiment, the one or more electronic components 301,302,303,304,305 can also include one or more infrared sensors. For example, in this embodiment, electrical components 302,305 comprise infrared sensors. When the printed circuit board assembly 100 is disposed in an earbud, and a housing of the earbud has a window proximately located with the infrared sensors, the infrared sensors can use a signal emitter that transmits a beam of infrared (IR) light, and then computes the distance to any nearby objects from characteristics of the returned, reflected signal. The returned signal may be detected using a signal receiver, such as an IR photodiode to detect reflected light emitting diode (LED) light, responding to modulated IR signals, and/or triangulation. When the earbud is placed within an ear, this can be detected by the infrared sensors. The control circuit can use this detected infrared reflection to active the remaining electrical components. Other proximity sensor components can be substituted for the infrared sensors, such as but not limited to, capacitive, magnetic, inductive, optical/photoelectric, laser, acoustic/sonic, radar-based, Doppler-based, thermal, and radiation-based proximity sensors.

In one embodiment, a black foam pad 306 can be disposed between various electronic components 301,302,303,304, 305. The black foam pad 306, in one embodiment, functions as a sensor isolator in that it minimizes signal leakage between, for example, infrared sensors. The black foam pad 306 can also isolate temperature sensors from hot electrical components.

One or more electromagnetic shields, e.g., electromagnetic shield 111 or electromagnetic shield 308, can be used in conjunction with the one or more electronic components 301,302,303,304,305. Electromagnetic shields are frequently found in radio frequency electronic devices or in other devices that may be sensitive to electromagnetic emissions. Shields are commonly used to isolate sensitive components residing on a circuit board. Electromagnetic shields are frequently made from a metal or metallized member that has a top surface and sidewalls extending orthogonally from each edge of the top surface. The bottom ends of the sidewalls may include feet or flanges so that the shield can be soldered to the circuit board.

In one embodiment, the electromagnetic shields are disposed along the major faces of the circuit boards. For example, electromagnetic shield 111 is disposed on the first major face 107 of the second circuit board 102. The electromagnetic shields can enclose one or more electronic components 301,302,303,304,305. In one embodiment, the electromagnetic shields 111,308 400 are manufactured from a sheet metal frame. For example, in one embodiment, the electromagnetic shields 111,308 can be machine formed from cold rolled steel. In other embodiments, the electromagnetic shields 111,308 can be manufactured from cast metal. Other materials and methods of manufacture for the shield will be obvious to those of ordinary skill in the art having the benefit of this disclosure.

In one embodiment, as noted above, the one or more electronic components 301,302,303,304,305,306 are powered by a battery, which will be discussed in more detail below with reference to FIGS. 6-9. To be able to draw current from such a battery, in one embodiment the printed circuit board assembly 100 includes one or more battery contacts. For example, in this illustrative embodiment a first set of battery contacts 112,113 is coupled to the second circuit board 102. Another battery contact 114 is coupled to the first circuit board 101. As will be shown below with reference to FIGS. 6-9, the first set of battery contacts 112,113 can electrically couple to a can of a battery, which is coupled to the positive terminal of the rechargeable cell disposed within the can. Battery contact 114 can then couple to a negative terminal of the rechargeable cell. In one embodiment, each of the first set of battery contacts 112,113 and the other battery contact 114 is coupled as a cantilevered arm that electrically couples to the battery via a preloading force delivered by cantilever forces of each of the first set of battery contacts 112,113 and the other battery contact 114.

In one embodiment, an insulating layer 204 can be disposed between the battery and the first circuit board 101 to electrically isolate the electrical components 203 disposed on the upper major face of the first circuit board from the negative terminal of the rechargeable cell. In the illustrative embodiment of FIGS. 1-5, the insulating layer 204 defines an aperture 205 through which battery contact 114 protrudes. In one embodiment, the insulating layer 204 is manufactured from an insulating material such as Kapton-.sup™. Other insulating materials suitable for the insulating layer 204 will be obvious to those of ordinary skill in the art having the benefit of this disclosure.

Electrical contacts 317 can be included for charging the battery. In this illustrative embodiment, the electrical contacts 317 are disposed along a bottom major face of the first circuit board 101. The electrical contacts 317 can charge the battery through the first set of battery contacts 112,113 and the other battery contact 114 in one embodiment. In one or more embodiments, the electrical contacts 317 can also be used for programming the one or more electrical circuits comprising electronic components 301,302,303,304,305 as well. For example, one or more of the electrical contacts 317 can be used to deliver firmware updates to the control circuit, and so forth.

One or more indicator devices can also be attached to the printed circuit board assembly 100. For example, in this embodiment, a light emitting diode 309 is disposed along the second major face 307 of the second circuit board 102. When the printed circuit board assembly 100 is disposed in an earbud, and a housing of the earbud has a window proximately located with the light emitting diode 309, it can project light through the window to provide device status to a user. For example, if the device is ON, the light emitting diode 309 may emit light. By contrast, if the device is OFF, the light emitting diode 309 may not emit light.

Figure 3:
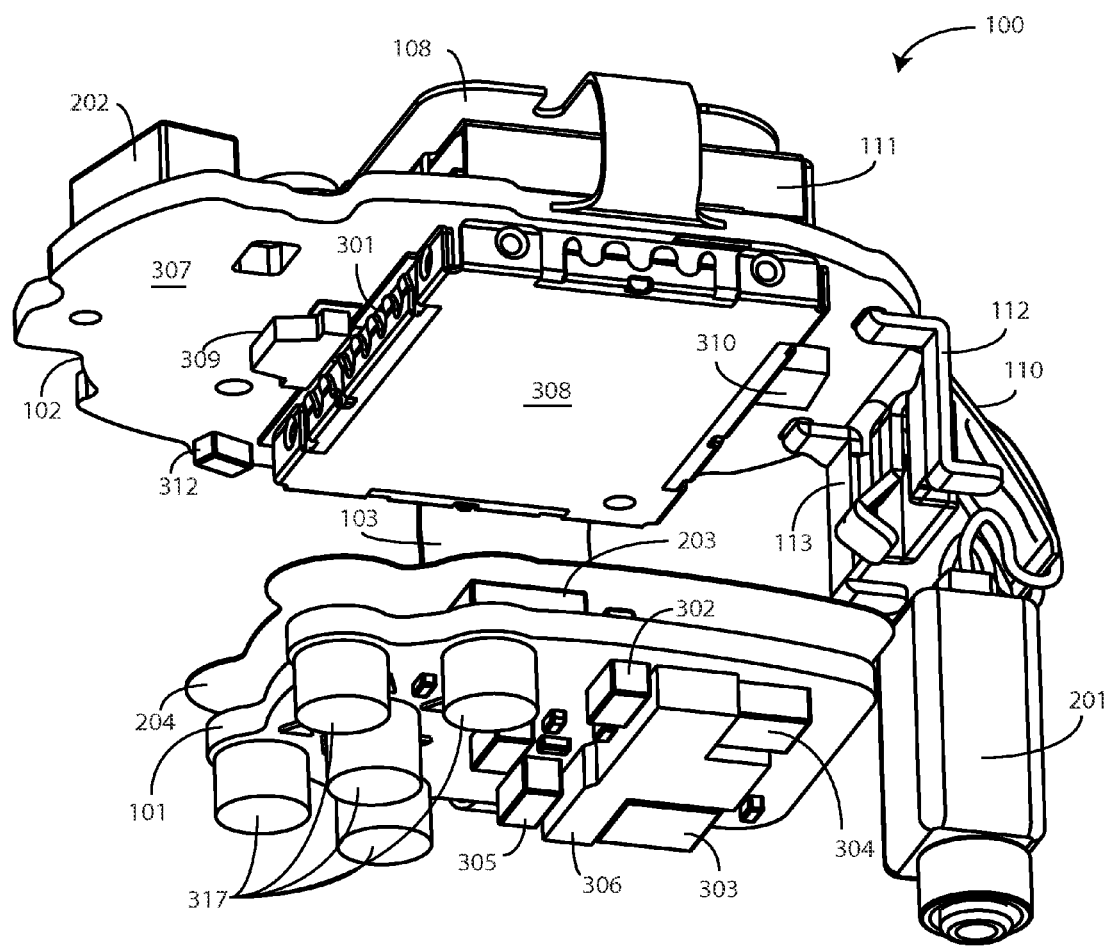
FIG. 3 illustrates another perspective view of one explanatory printed circuit board assembly in accordance with one or more embodiments of the disclosure.
Figure 4:
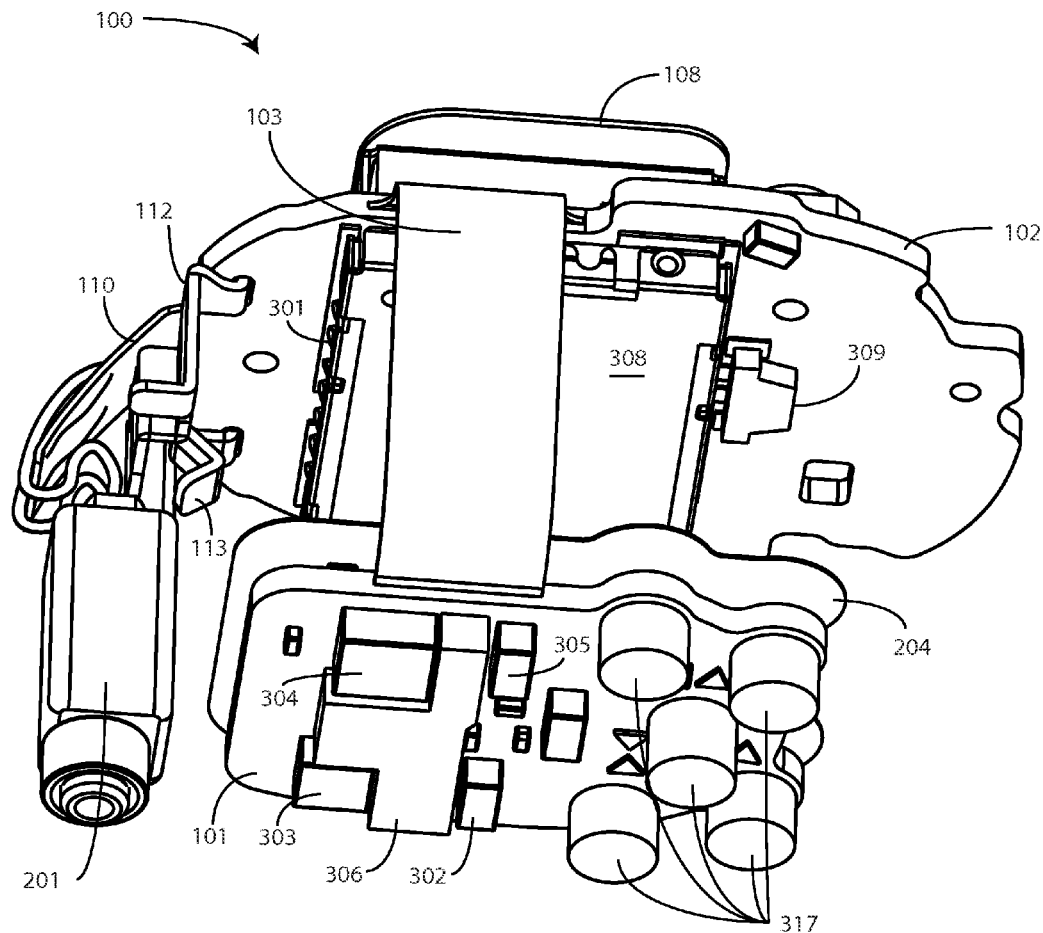
FIG. 4 illustrates yet another perspective view of one explanatory printed circuit board assembly in accordance with one or more embodiments of the disclosure.

In one or more embodiments, one or more microphones may be disposed on one or more of the first major face of the first circuit board 101, the second major face of the first circuit board, the first major face 107 of the second circuit board 102, the second major face 307 of the second circuit board 102, or combinations thereof. In this illustrative embodiment, as best shown in FIG. 3, a first microphone 310 and a second microphone 311, operable with the one or more electronic circuits comprising electronic components 301, 302,303,304,305, are disposed along the second circuit board 102. In this embodiment, the first microphone 310 and the second microphone 311 are disposed on the second major face 307 of the second circuit board 102, which is an opposite side the one or more electronic circuits disposed beneath electromagnetic shield 111.

In one embodiment, since the first microphone 310 and the second microphone 311 are disposed on the bottom of the second circuit board 102, the second circuit board 102 defines one or more apertures 205,206 through which the first microphone 310 and the second microphone 311 receive sound, respectively. It should be noted that in the illustrative embodiment of FIGS. 1-5, the first microphone 310 and the second microphone 311 are disposed along a first side of the second circuit board 102, while the chip antenna 202 of the wireless communication circuit is disposed along a second side of the second circuit board 102. Here, the first microphone 310 and the second microphone 311 are disposed along the second major face 307 of the second circuit board 102, while the chip antenna 202 is disposed along the first major face 107 of the second circuit board 102. This "opposite microphone to antenna" placement provides isolation between the chip antenna 202 and the first microphone 310 and the second microphone 311.

In one embodiment, since the first microphone 310 and the second microphone 311 are disposed on the bottom side of the second circuit board, an acoustic porting device 207 can be disposed on the top side of the board to channel acoustic energy from an exterior housing of a device into which the printed circuit board assembly 100 is disposed an one or both of the first microphone 310 and the second microphone 311.

Figure 2:
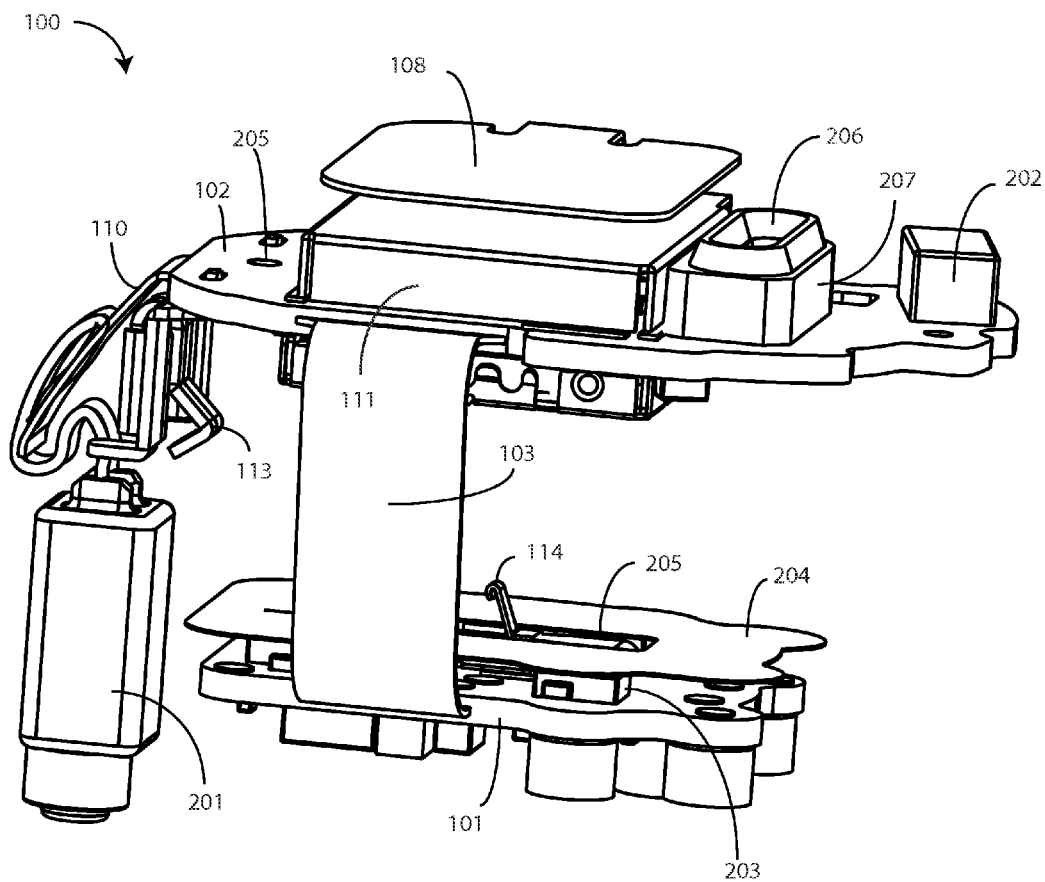
FIG. 2 illustrates another perspective view of one explanatory printed circuit board assembly in accordance with one or more embodiments of the disclosure.
Figure 5:
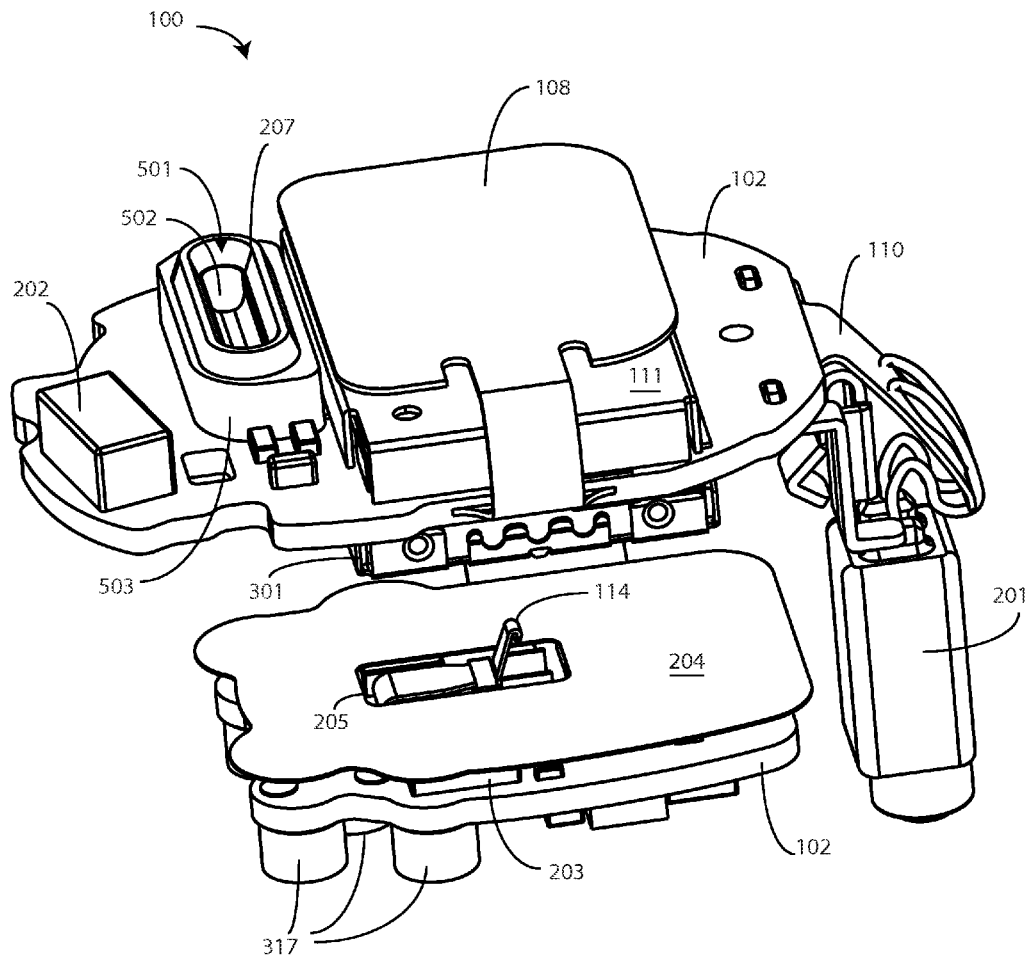
FIG. 5 illustrates still another perspective view of one explanatory printed circuit board assembly in accordance with one or more embodiments of the disclosure.
Figure 6:
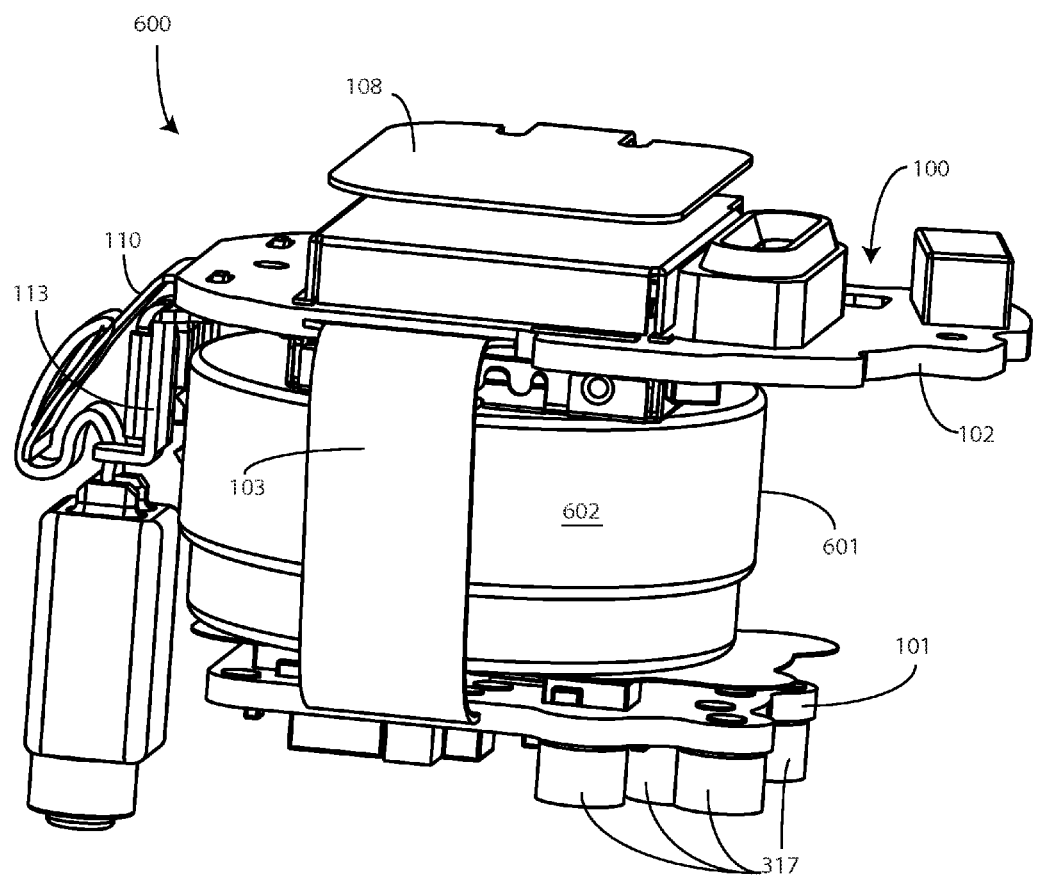
FIG. 6 illustrates a first perspective view of one explanatory circuit assembly configured in accordance with one or more embodiments of the disclosure.
Figure 7:
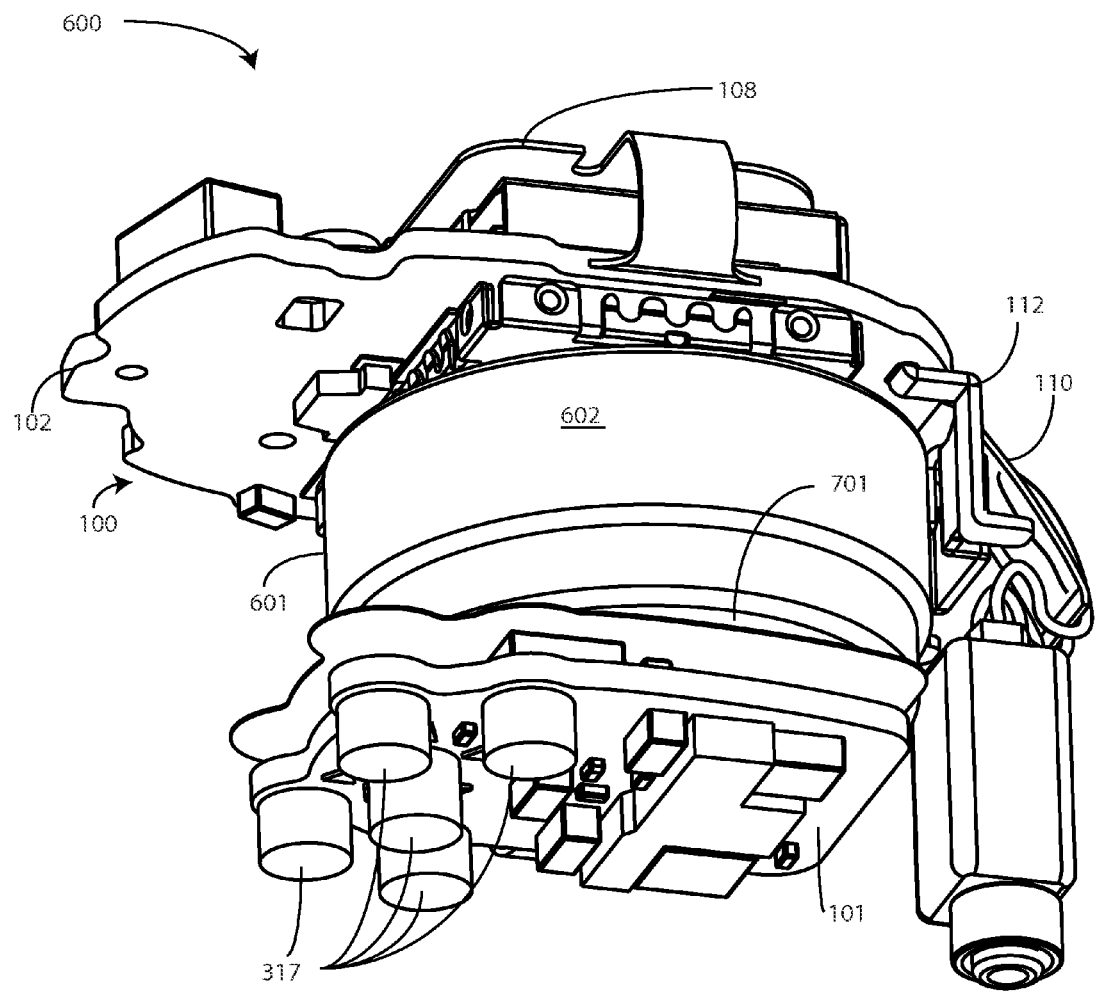
FIG. 7 illustrates a second perspective view of one explanatory circuit assembly in accordance with one or more embodiments of the disclosure.
Figure 8:
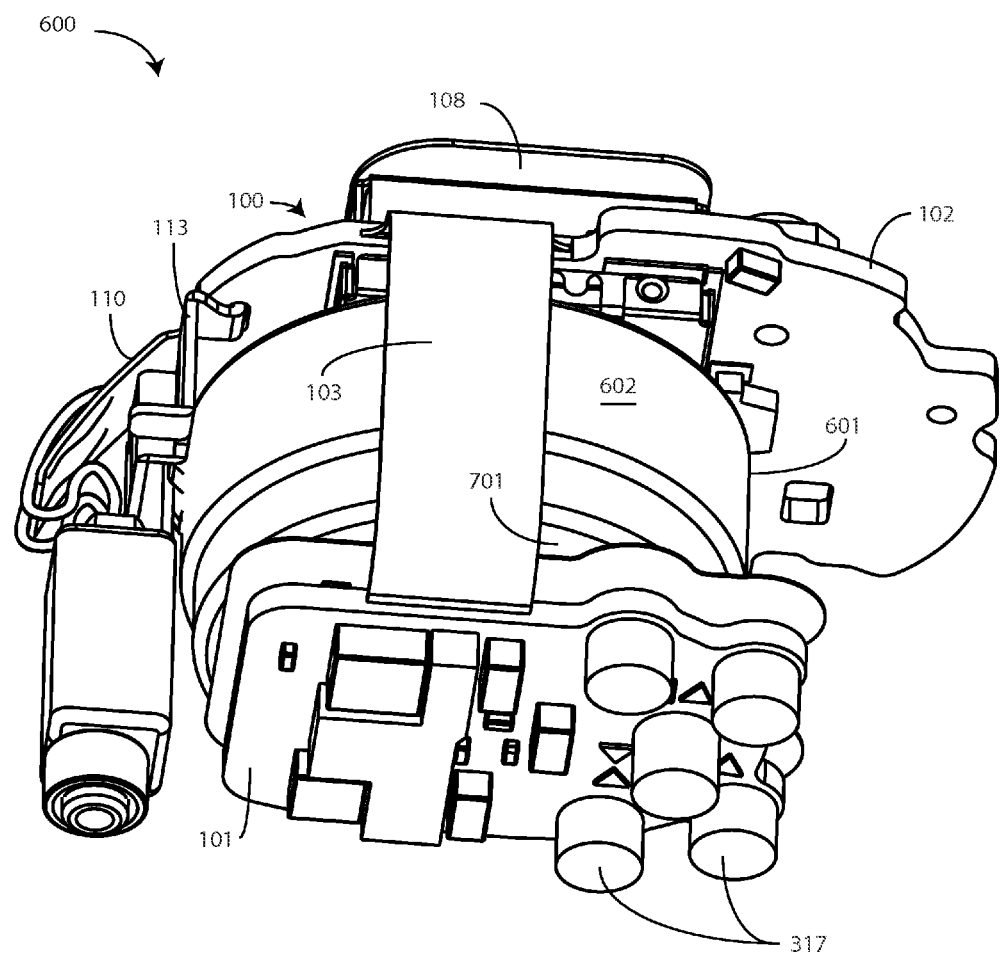
FIG. 8 illustrates another perspective view of one explanatory circuit assembly in accordance with one or more embodiments of the disclosure.
Figure 9:
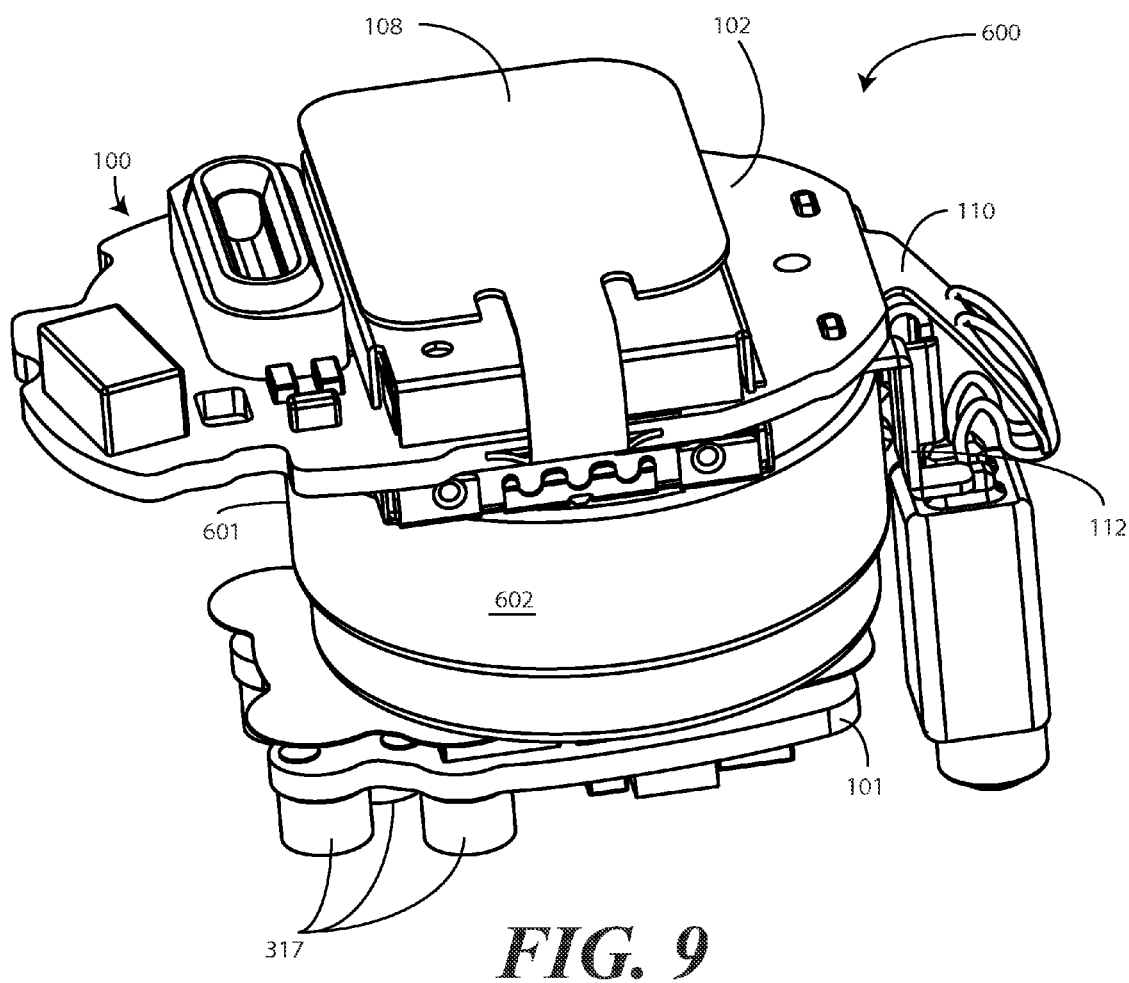
FIG. 9 illustrates yet another perspective view of one explanatory circuit assembly in accordance with one or more embodiments of the disclosure.
Figure 10:
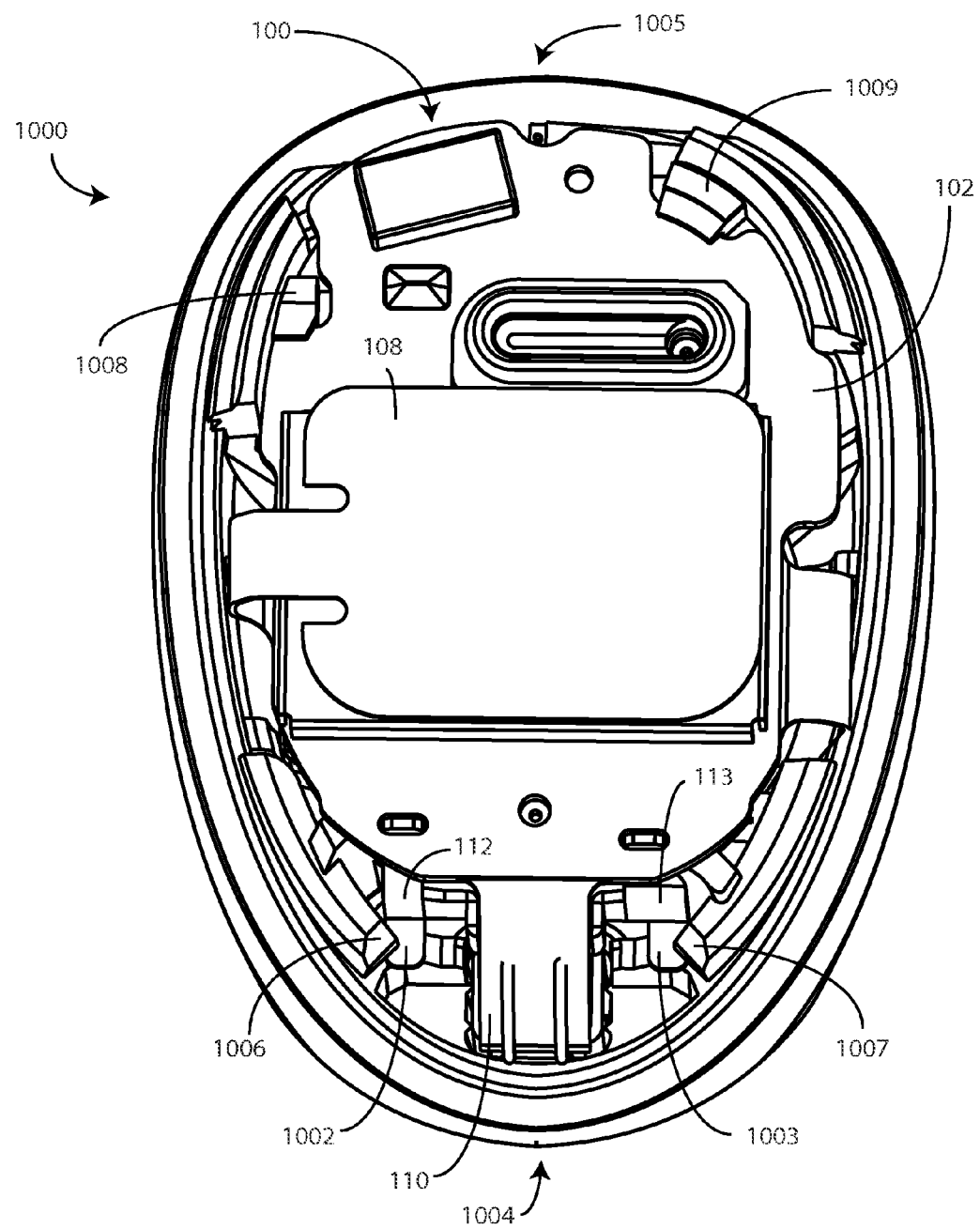
FIG. 10 illustrates a top plan view of one explanatory assembly in accordance with one or more embodiments of the disclosure.
Figure 11:
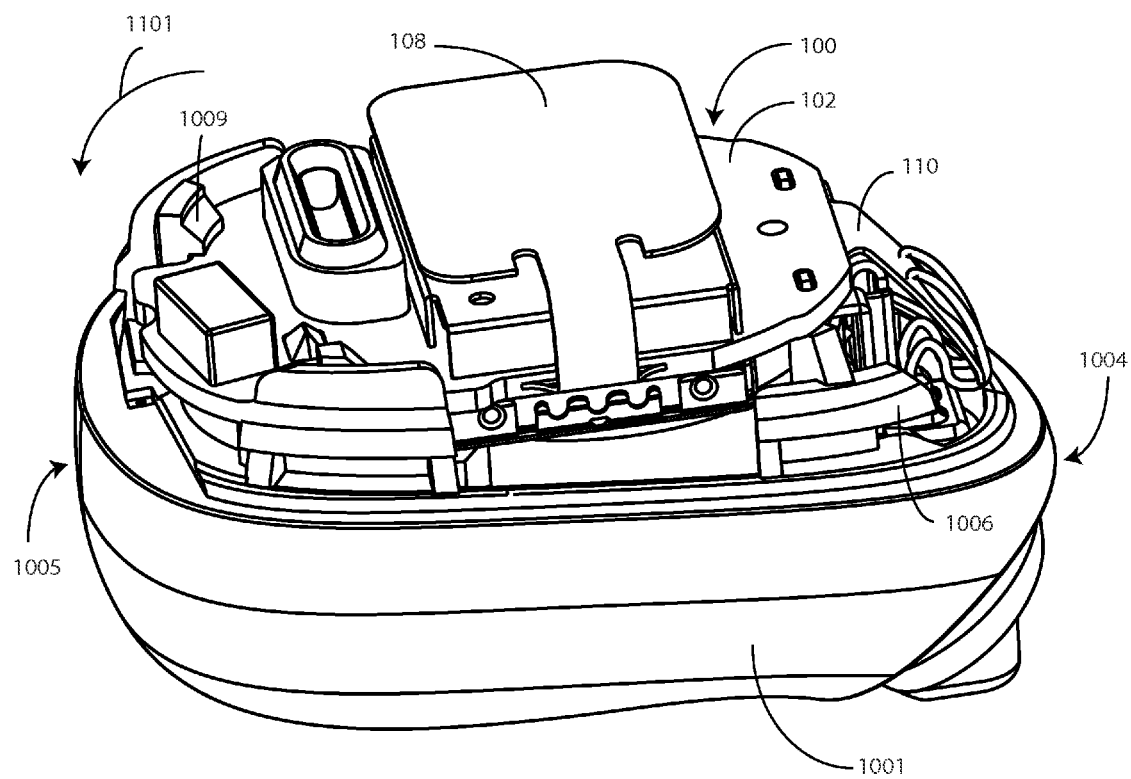
FIG. 11 illustrates a first perspective view of one explanatory assembly in accordance with one or more embodiments of the disclosure.
Figure 12:
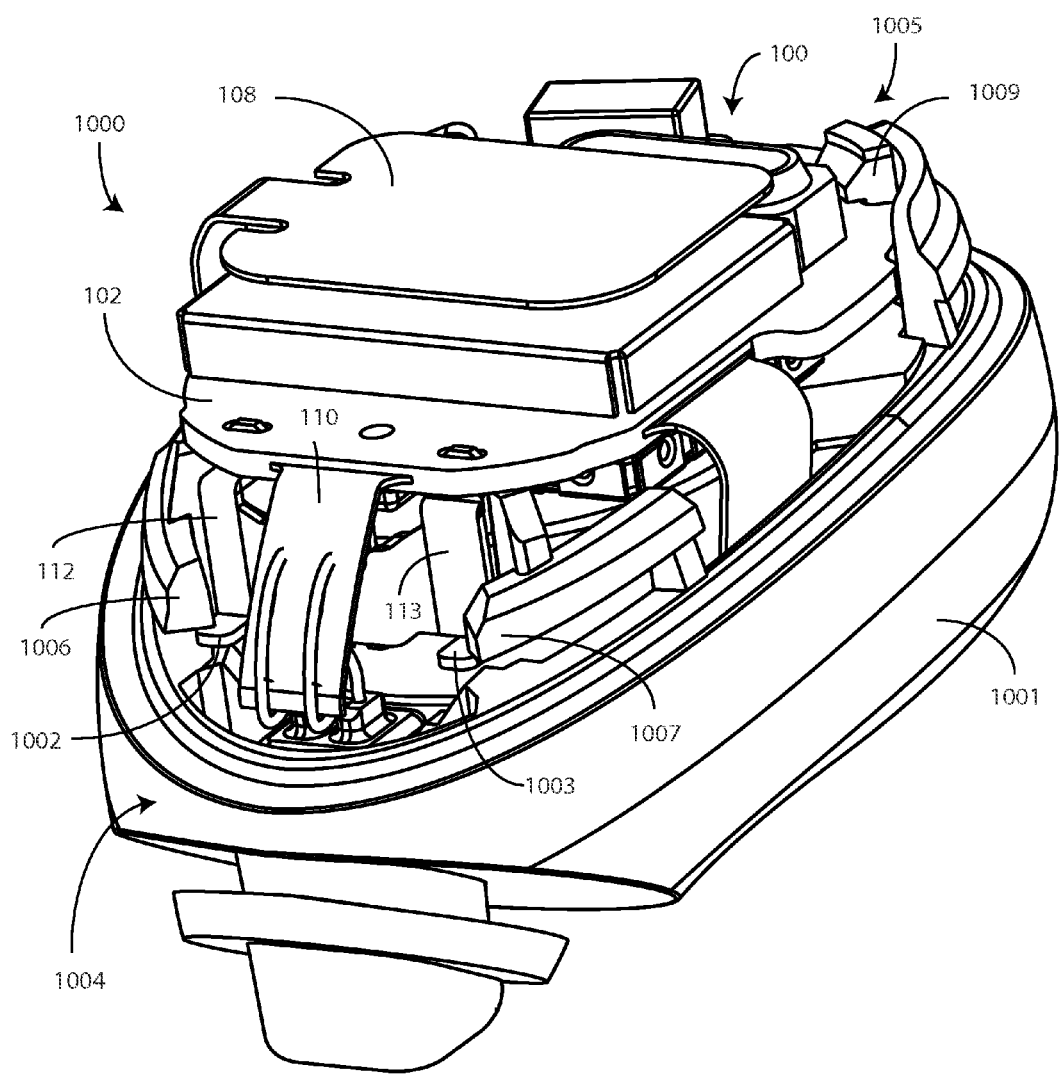
FIG. 12 illustrates another perspective view of one explanatory assembly in accordance with one or more embodiments of the disclosure.
Figure 13:
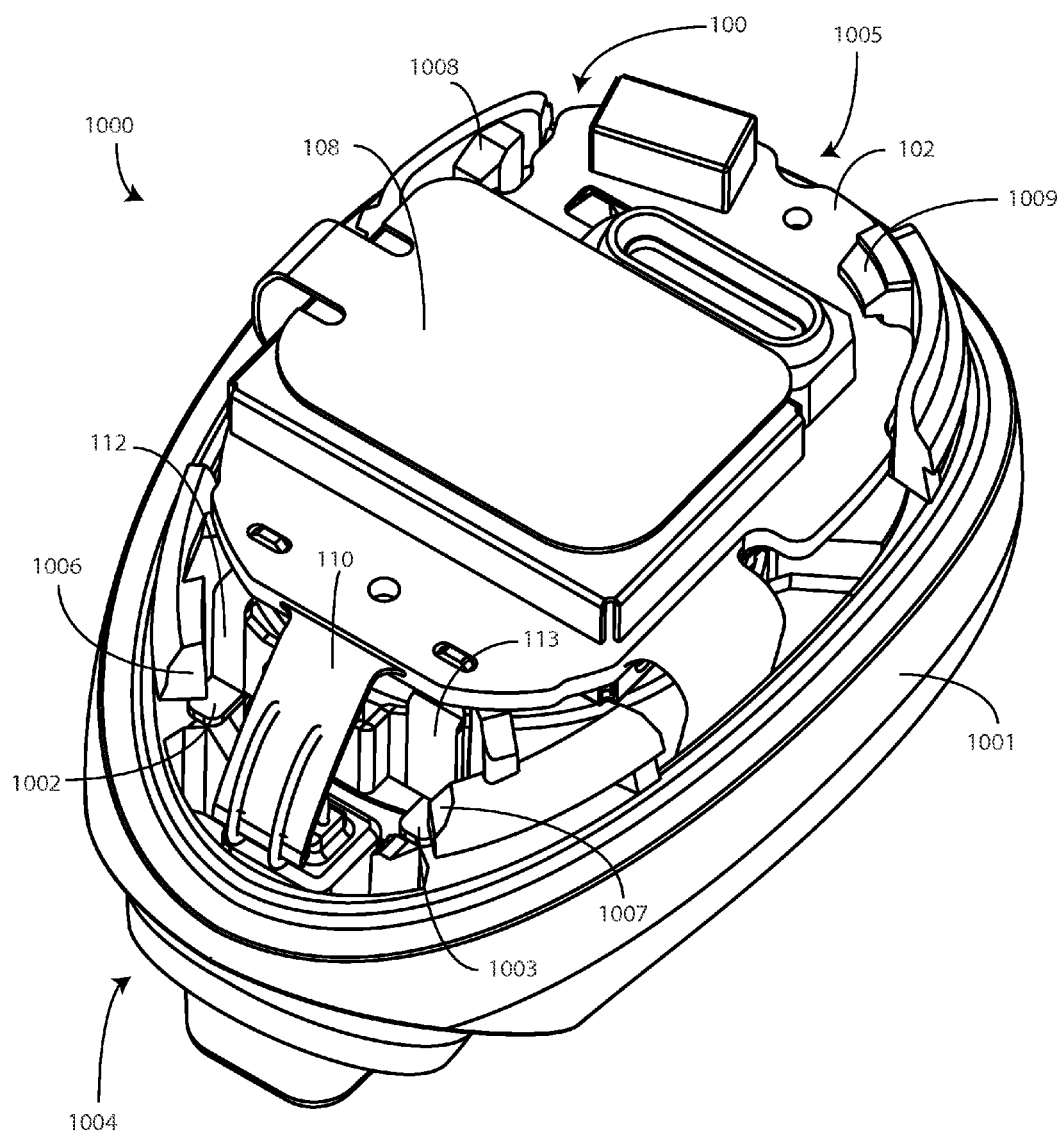
FIG. 13 illustrates another perspective view of one explanatory assembly in accordance with one or more embodiments of the disclosure.

As will be shown in more detail below with reference to FIG. 14, the illustrative acoustic porting device 207 of FIG. 2 comprises a periscope port, which is an acoustic port that makes one or more orthogonal bends. As best shown in FIG. 5, the illustrative acoustic porting device 207 of this embodiment includes a channel 501 to receive acoustic energy at a first side 502 of the acoustic porting device 207, translate it through the periscope port, and deliver it out the bottom of the acoustic porting device 207 at a second side 503 of the acoustic porting device 207. Thus, the periscope port allows for greater separation between, for example, the chip antenna 202 of the wireless communication circuit and the second microphone 311. In one embodiment, this separation is at least four millimeters.

Turning now to FIGS. 6-9, illustrated therein is one explanatory circuit assembly 600 in accordance with one or more embodiments of the disclosure. The circuit assembly 600 includes the printed circuit board assembly 100 of FIGS. 1-5 and a battery 601, which in this illustrative embodiment is a rechargeable battery. As noted above, in one embodiment one or more of the electrical contacts 317 can be used for charging the rechargeable battery.

As shown in FIGS. 6-9, the printed circuit board assembly 100 is unitary in that the first circuit board 101, the second circuit board 102, the first flexible substrate 103, the second flexible substrate 108, and the third flexible substrate 110 are all continuously coupled together without any connectors. This unitary assembly is folded about the battery 601 on at least three sides. The first circuit board 101 is disposed along the bottom of the battery 601, while the second circuit board 102 is disposed along the top of the battery 601. The first flexible substrate 103 is disposed along a first side of the battery 601, while the third flexible substrate 110 is folded about a second side of the battery 601.

The battery 601 relies upon an electrochemical cell stored within the battery 601 for energy storage. While other structural components may be disposed within the "can" of the illustrative coin cell shown in FIGS. 6-9, the primary function of the battery 601 is to store and release energy via the electrochemical cell.

Electrochemical cells are generally made from a positive electrode (cathode), a negative electrode (anode), and a separator that prevents these two electrodes from touching. While the separator electrically separates the cathode and anode, the separator permits ions to pass through the separator and be exchanged between the cathode and the anode.

The electrochemical cell of the battery 601 includes a separator having a top and bottom. Disposed on the top of the separator is a first layer of an electrochemically active material. For example, in a nickel metal hydride cell, the first layer may be a layer of a metal hydride charge storage material. Alternatively, the first layer may be lithium or a lithium intercalation material as is commonly employed in lithium cells. As lithium-based cells offer greater energy density than do nickel metal hydride or other types of cells, in one embodiment the battery 601 is a lithium-based battery.

Disposed atop the first layer of electrochemically active material is a current collecting layer. The current collecting layer may be fabricated of any of a number of metals or alloys known in the art. Examples of such metals or alloys include, for example, nickel, aluminum, copper, steel, nickel plated steel, magnesium doped aluminum, and so forth. Disposed atop the current collecting layer is a second layer of electrochemically active material.

The electrochemical cell stores and delivers energy by transferring ions between electrodes through a separator. For example, during discharge, an electrochemical reaction occurs between electrodes. This electrochemical reaction results in ion transfer through the separator, and causes electrons to collect at the negative terminal of the cell. When connected to a load, such as an electronic device, the electrons flow from the negative pole through the circuitry in the load to the positive terminal of the cell. This is shown in circuit diagrams as current flowing from the cathode to the anode. When the electrochemical cell is charged, the opposite process occurs. Thus, to power electronic devices, these electrons must be delivered from the cell to the electronic device.

In the embodiment of FIGS. 6-9, this is accomplished via the first set of battery contacts 112,113 and the other battery contact (114). When the circuit assembly 600 is placed into a housing, the first set of battery contacts 112,113 deflect to contact the side 602 of the battery. As the printed circuit board assembly 100 is wrapped about the battery 601, the other battery contact (114) is biased against the negative tab 701 of the battery 601, thereby completing the electrical circuit by which the electrochemical cell of the battery 601 can be charged or discharged.

Turning now to FIGS. 10-13, illustrated therein is a device 1000 with part of its housing removed to illustrate the internal components. The device 1000 includes a housing 1001 to insert into the ear of a user. The housing 1001 includes a first side 1004 and a distally located second side 1005. The printed circuit board assembly 100 is disposed within the housing 1001. As noted above, in one embodiment the device 1000 is sufficiently compact as to seat flush or below the outer surface/end of the tragus portion of the ear. This low profile insertion capability is unlike prior art headsets, which have portions seating well above the tragus, and that are always visible to others.

To accommodate this small form factor, the printed circuit board assembly 100 has been creatively designed to keep assembly of the device 1000 simple, reliable, and robust. Illustrating by example, in one embodiment the first set of battery contacts 112,113 include one or more feet 1002,1003 to interlock the circuit assembly (600) into the housing 1001. The housing 1001 then defines one or more foot receivers 1006,1007 to receive the one or more feet 1002,1003 (two feet 1002,1003 in this embodiment, one for each battery contact 112,113). In this embodiment, the one or more foot receivers 1006,1007 are disposed adjacent to the first side 1004 of the housing 1001.

In this embodiment, the housing 1001 also includes one or more cantilevered latches 1008,1009. In this embodiment, the one or more cantilevered latches 1008,1009 are disposed adjacent to the second side 1005 of the housing 1001.

To assemble the device 1000, a machine or technician inserts the one or more feet 1002,1003 of the first set of battery contacts 112,113 into the one or more foot receivers 1106,1107. This not only locks the circuit assembly (600) into the first side 1004 of the housing, but also ensures that the first set of battery contacts 112,113 are biased against the side (602) of the battery (601). The machine or technician thin pivots 1101 the circuit assembly (600) toward the second side 1005 of the housing 1001 to lock the second circuit board 102 under the one or more cantilevered latches 1008,1009. The latching not only secures the circuit assembly (600) into the second side 1005 of the housing 1001, but also ensures that the first circuit board (101) and the second circuit board 102 sufficiently compress about the battery (601) such that the other battery contact (114) electrically couples to the negative tab (701) of the battery (601). Thus, the one or more cantilevered latches 1008,1009 interlock the unitary printed circuit board assembly 100 and the battery (601) within the housing 1001 when the two or more feet 1002,1003 are disposed within the one or more foot receivers 1006,1007.

Note that when this occurs, the third flexible substrate 110, which has the acoustic driver (201) attached thereto, is disposed between the two or more feet 1002,1003. This allows the acoustic driver (201) to seat within an acoustic driver port as will be shown below with reference to FIG. 14.

Note that the second flexible substrate 108 has been folded atop the second circuit board 102 to define a capacitive sensor. When the upper housing (1401) is attached to the housing of FIGS. 10-13, the second flexible substrate 108 will be disposed adjacent to the surface of the upper housing such that the top of the upper housing defines a capacitive touch sensor that a user may actuate simply by touch.

Figure 14:
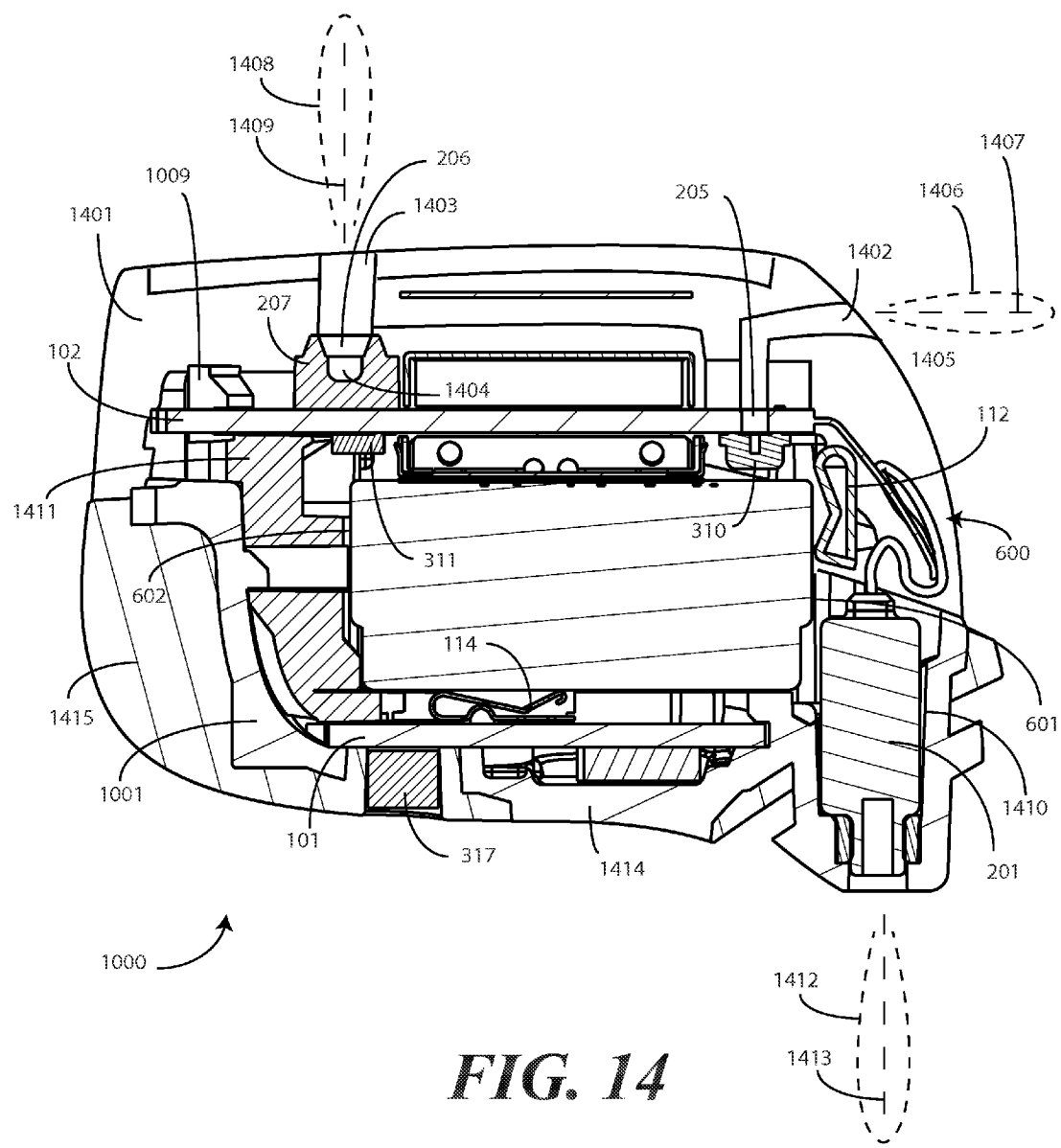
FIG. 14 illustrates a sectional view of one explanatory assembly in accordance with one or more embodiments of the disclosure.

Turning now to FIG. 14, illustrated therein is a sectional view of the completed device 1000 showing the various internal components. As shown in FIG. 14, an upper housing 1401 has been attached to housing 1001. The circuit assembly 600 of FIGS. 6-9 has been inserted within the housing 1001 with the one or more feet (1002,1003) of the first set of battery contacts 112, (113) into the one or more foot receivers (1106,1107). The second circuit board 102 is latched under the one or more cantilevered latches (1008), 1009, thereby securing the circuit assembly within the housing 1001. The first set of battery contacts 112, (113) is biased against the side 602 of the battery 601, and the other battery contact 114 is biased against the negative tab 701 of the battery 601. The one or more electrical contacts 317 are exposed through an aperture of the housing 1001 to permit charging of the battery 601 and, optionally, programming of the control circuit or other processors of the device 1000.

Shown on the second circuit board 102 are the first microphone 310 and the second microphone 311. As shown, they are disposed on the bottom of the second circuit board 102. The second circuit board 102 then includes one or more apertures 205,206 such that the first microphone 310 and the second microphone 311 can receive acoustic energy from the top side of the second circuit board 102. An optional microphone boot 1405 can be disposed along the top side of the second circuit board 102 to seal the acoustic path from the exterior of the device 1000 to the first microphone 310.

An acoustic porting device 207 is disposed on the top side of the second circuit board 102 to channel acoustic energy from the exterior of the upper housing 1401 of the device 1000 into which the circuit assembly 600 is disposed to the second microphone 311 The upper housing 1401 defines a first microphone port 1402 to direct acoustic energy to the first microphone 310 and a second microphone port 1403 to direct acoustic energy through the periscope port 1404 of the acoustic porting device 207 to the second microphone 311.

As noted above, the periscope port 1404 includes two orthogonal, or substantially orthogonal turns. Thus, sound enters one end of the acoustic porting device 207 and travels toward the second circuit board 102. The sound then turns and travels across the acoustic porting device 207 substantially parallel to the second circuit board 102. The sound then turns yet again to travel toward the second circuit board 102 and to the second microphone 311.

In this illustrative embodiment, the first microphone port 1402 and the first microphone 310 are oriented to define a first beam 1406 along a first axis 1407 from which acoustic energy is received. Similarly, the second microphone port 1403 and the second microphone 311 are oriented to define a second beam 1408 along a second axis 1409. In this embodiment, the first axis 1407 and the second axis 1409 are separated by at least ninety degrees to provide isolation between ambient noise received along the second beam 1408 by the second microphone 311 and sound from the user received along the first beam 1406 by the first microphone 310. When the device 1000 is positioned in the user's ear, the first beam 1406 is directed toward the user's mouth, while the second beam 1408 is directed toward the environment disposed about the user.

The housing 1001 of this illustrative embodiment also defines an acoustic driver port 1410. The acoustic driver 201 is positioned within the acoustic driver port 1410 to define a third beam 1412 defined along a third axis 1413. When the device 1000 is positioned within the user's ear, this third axis 1413 is oriented between the acoustic driver 201 and the user's eardrum. The acoustic driver 201 delivers sound to the user's ear along the third beam 1412. In this illustrative embodiment, the third axis 1413 is substantially parallel to the second axis 1409. However, the first axis 1407 is substantially orthogonal to both the second axis 1409 and the third axis 1413 in this illustrative embodiment. The term "substantially" is used to refer to an orientation inclusive of manufacturing tolerances. Accordingly, where the manufacturing tolerances are plus or minus one degree, "substantially orthogonal" means between 89 and 91 degrees.

In this illustrative embodiment, an interior housing member 1411 is also disposed within the housing 1001. The interior housing member 1411 serves as an inner locking mechanism that snaps in place to lock the first circuit board 101 in the housing 1001. Use of the interior housing member 1411 is optional.

An infrared window 1414 is disposed along the bottom of the housing 1001. Recall from above that in one embodiment the one or more electronic components (301,302,303, 304,305) of the printed circuit board assembly (100) can also include one or more infrared sensors. When the printed circuit board assembly (100) is disposed in the housing 1001, the infrared window 1414 is proximately located with the infrared sensors. Accordingly, the infrared sensors can use a signal emitter that transmits a beam of infrared (IR) light through the infrared window 1414 and then computes the distance to any nearby objects from characteristics of the returned, reflected signal. The control circuit can then determine that the device 1000 is disposed in a user's ear when the returned, reflected signal saturates. In one embodiment, the infrared window 1414 is part of the interior housing member 1411. Thus, in one embodiment the interior housing member 1411 is manufactured from a clear material, such as a clear thermoplastic.

In one embodiment, the housing 1001 is surrounded, or at least partially surrounded, by a soft, outer rubber layer 1415. The soft, outer rubber layer 1415, while optional, aids in user comfort by providing a soft surface against the contours of the user's ear.

Figure 15:
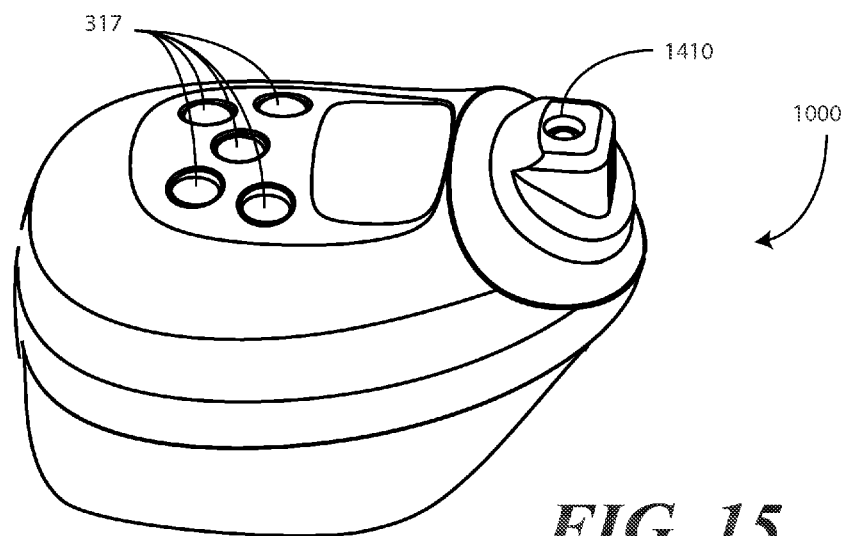
FIG. 15 illustrates one explanatory device in accordance with one or more embodiments of the disclosure.

Turning now to FIG. 15, illustrated therein is the completed device 1000 shown in perspective view from the bottom. The electrical contacts 317 for charging the battery (601) and optionally programming the control circuit are shown, as is the acoustic driver port 1410.

Figure 16:
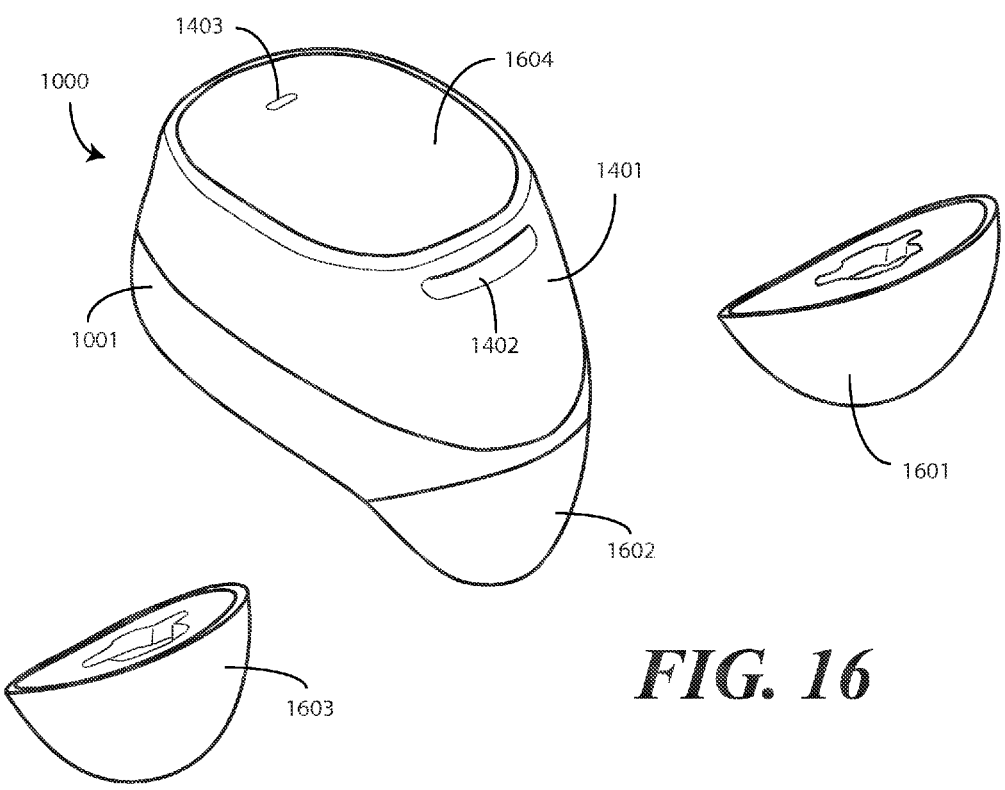
FIG. 16 illustrates another explanatory device in accordance with one or more embodiments of the disclosure.

Turning to FIG. 16, a top perspective view of the device 1000 is shown. Here the first microphone port 1402 and the second microphone port 1403 can be seen, along with their substantially orthogonal relationship. In this illustrative embodiment, the first microphone port 1402 is substantially larger than the second microphone port 1403 so as to capture more sound One of several cushion elements 1601,1602,1603 can be attached to the housing 1001 to provide an acoustic seal between a user's ear canal and the housing 1001. The cushion elements 1601,1602,1603 can be manufactured in varying sizes so that the device 1000 can be used in different sized ears. The upper surface 1604 defines a capacitive touchpad due to the fact that the second flexible substrate (108) is disposed adjacent to the upper surface of the upper housing 1401.

As described, embodiments of the disclosure provide for a compact device 1000, suitable for use in a person's ear, that employs a printed circuit board assembly comprising rigid circuit boards interspaced with flexible substrates. The printed circuit board assembly can be folded about a battery to provide a compact, low profile, and high-performance circuit assembly. Elements of the printed circuit board assembly, such as battery contacts, are strategically designed to assist in manufacture and to make the resulting device more robust.

Microphone ports can be oriented in different directions to capture different acoustic signals. Acoustic porting devices can be used with microphones to provide greater separation between, for example, a microphone and an antenna. Periscope porting can translate sound laterally along a circuit board to further increase this separation to maximize performance of the radio frequency antenna. Microphones can further be disposed at opposite sides of a printed circuit board to maximize distances between a first microphone port and a second microphone port. This can assist in improving echo cancelation or noise reduction. The beams defined by each microphone port can be oriented in different directions, and can also be different sizes, so as to capture more acoustic energy from the user than from the environment. Such orientation further enhances the separation of those two audio signals, i.e., the primary audio/speech signal and the background noise signal, for digital/software processing.

Embodiments of the disclosure advantageously integrate and optimize of a number of mechanical and electrical devices and elements to deliver a compact design for an in-ear device. Microphone location and porting are implemented in a smaller footprint than on any prior art devices. The S-shaped folding of the printed circuit board assembly about a battery, such that the battery is captivated within the printed circuit board assembly with one or more battery contacts locking the printed circuit board in place in a housing are additional novel aspects. Others will be obvious to those of ordinary skill in the art having the benefit of this disclosure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A circuit assembly, comprising:
a printed circuit board assembly, comprising:
a first circuit board;
a second circuit board;
a first flexible substrate interposed between, and continuous with, the first circuit board and the second circuit board; and
a second flexible substrate extending from, and continuous with, the second circuit board;
one or more electronic circuits disposed along one or more of the first circuit board or the second circuit board; and
a battery to power the one or more electronic circuits, the battery comprising a first major face, a second major face, and one or more side faces;
the printed circuit board assembly folded about the battery with the first circuit board adjacent to the first major face, the second circuit board adjacent to the second major face, and the first flexible substrate spanning the one or more side faces.

2. The circuit assembly of claim 1, the second flexible substrate folded back atop the second circuit board.

3. The circuit assembly of claim 2, the second flexible substrate operable with the one or more electronic circuits to define a capacitive touch sensor.

4. The circuit assembly of claim 3, the printed circuit board assembly folded in a S-shape.

5. The circuit assembly of claim 1, further comprising a third flexible substrate extending from, and continuous with, the second circuit board.

6. The circuit assembly of claim 5, further comprising an acoustic driver operable with the one or more electronic circuits, the acoustic driver coupled to the third flexible substrate.

7. The circuit assembly of claim 1, further comprising battery contact coupled to the second circuit board.

8. The circuit assembly of claim 7, further comprising another battery contact coupled to the first circuit board.

9. The circuit assembly of claim 7, further comprising a housing, the battery contact comprising one or more feet to interlock the circuit assembly into the housing.

10. The circuit assembly of claim 1, further comprising a first microphone and a second microphone, operable with the one or more electronic circuits, and disposed along the second circuit board on opposite sides of the one or more electronic circuits.

11. The circuit assembly of claim 10, further comprising an antenna, operable with the one or more electronic circuits, and disposed along the second circuit board, wherein:
the first microphone and the second microphone are disposed along a first side of the second circuit board; and
the antenna is disposed along a second side of the second circuit board.

12. An assembly, comprising:
a housing to insert into an ear of a user;
a printed circuit board assembly disposed within the housing;
one or more electronic circuits disposed along the printed circuit board assembly; and
a first microphone and a second microphone disposed along the printed circuit board assembly;
the housing defining a first microphone port and a second microphone port;
the first microphone port and the first microphone oriented to define a first beam along a first axis;
the second microphone port and the second microphone oriented to define a second beam along a second axis;
the first axis and the second axis separated by at least ninety degrees;
an acoustic porting device disposed between the second microphone port and the second microphone, the acoustic porting device defining a periscope port; and
the printed circuit board assembly comprising at least one circuit board, the second microphone disposed on a first side of the at least one circuit board, the acoustic porting device disposed on a second side of the at least one circuit board.

13. The assembly of claim 12, the first microphone port larger than the second microphone port.

14. The assembly of claim 12, further comprising acoustic driver coupled to the printed circuit board assembly, the housing defining an acoustic driver port, the acoustic driver and the acoustic driver port oriented to define a third beam along a third axis, the first axis oriented substantially orthogonally from both the second axis and the third axis.

15. The assembly of claim 12, the printed circuit board assembly comprising:
a first circuit board;
a second circuit board;
a first flexible substrate interposed between, and continuous with, the first circuit board and the second circuit board; and
a second flexible substrate extending from, and continuous with, the second circuit board;
the printed circuit board assembly folded in a S-shape within the housing.

16. An assembly, comprising:
a battery;
a unitary printed circuit board assembly comprising at least two rigid circuit boards interposed by a flexible substrate continuously coupled to the at least two rigid circuit boards, with the unitary printed circuit board assembly folded about the battery on at least three sides;
a battery contact coupled to a rigid circuit board, the battery contact defining two or more feet; and
a housing comprising a first side and a second side disposed distally from the first side, the first side defining one or more foot receivers to receive the two or more feet of the battery contact, the housing further comprising one or more cantilevered latches disposed adjacent to the second side;
the one or more cantilevered latches to interlock the unitary printed circuit board assembly and the battery within the housing when the two or more feet are disposed within the one or more foot receivers.

17. The assembly of claim 16, further comprising a second flexible substrate extending from the rigid circuit board and an acoustic driver coupled to the second flexible substrate, the second flexible substrate disposed between the two or more feet.

18. The assembly of claim 17, further comprising a third flexible substrate extending from the rigid circuit board and folded atop the rigid circuit board to define a capacitive sensor disposed adjacent to a surface of the housing.

* * * * *